United States Patent
Tomita

(10) Patent No.: US 8,158,940 B2
(45) Date of Patent: Apr. 17, 2012

(54) MAGNETIC DOMAIN IMAGING SYSTEM

(75) Inventor: Takeshi Tomita, Tokyo (JP)

(73) Assignee: JEOL Ltd., Tokyo (JP)

( * ) Notice: Subject to any disclaimer, the term of this patent is extended or adjusted under 35 U.S.C. 154(b) by 206 days.

(21) Appl. No.: 12/781,121

(22) Filed: May 17, 2010

(65) Prior Publication Data

US 2010/0294932 A1 Nov. 25, 2010

(30) Foreign Application Priority Data

May 20, 2009 (JP) ................................. 2009-121768

(51) Int. Cl.
- *H01J 37/26* (2006.01)
- *H01J 37/147* (2006.01)
- *H01J 3/14* (2006.01)

(52) U.S. Cl. ................. 250/311; 250/310; 250/396 ML; 324/260; 324/262

(58) Field of Classification Search .................. 250/306, 250/307, 310, 311, 396 ML, 526; 324/200, 324/205, 210, 211, 213, 228, 232, 244, 244.1, 324/249, 258, 262
See application file for complete search history.

(56) References Cited

U.S. PATENT DOCUMENTS

| | | | | |
|---|---|---|---|---|
| 6,838,675 B2 * | 1/2005 | Harada et al. | .......... | 250/396 ML |
| 7,560,921 B2 * | 7/2009 | Ishio et al. | .......... | 324/244 |
| 2007/0194230 A1 * | 8/2007 | Kohashi et al. | .......... | 250/310 |
| 2008/0284422 A1 * | 11/2008 | Ishio et al. | .......... | 324/226 |
| 2011/0031395 A1 * | 2/2011 | Harada et al. | .......... | 250/307 |

FOREIGN PATENT DOCUMENTS

| | | |
|---|---|---|
| JP | 8-96737 A | 4/1996 |
| JP | 2007-80724 | 3/2007 |

* cited by examiner

*Primary Examiner* — Bernard E Souw
(74) *Attorney, Agent, or Firm* — The Webb Law Firm

(57) ABSTRACT

A magnetic domain imaging system is offered which permits application of a strong magnetic field to a specimen. The imaging system includes a transmission electron microscope having an objective lens. The specimen that is magnetic in nature is placed in the upper polepiece of the objective lens. An electron beam transmitted through the specimen is imaged and displayed on a display device. A field application coil assembly for applying a magnetic field to the specimen and two deflection coil assemblies for bringing the beam deflected by the field applied to the specimen back to the optical axis are mounted in the upper polepiece.

7 Claims, 5 Drawing Sheets

MAGNETIC DOMAIN IMAGING SYSTEM

BACKGROUND OF THE INVENTION

1. Field of the Invention

The present invention relates to a magnetic domain imaging system, i.e., an apparatus permitting one to observe magnetic domains in a magnetic specimen.

2. Description of Related Art

From the past, systems for obtaining transmission images of magnetic specimens using a transmission electron microscope have been known. In order to obtain an accurate image of a specimen, it is necessary to cause an electron beam transmitted through the specimen to be focused along the optical axis. FIG. 3 shows an example of configuration of the prior art instrument of the top entry type, i.e., a magnetic specimen is inserted from top to objective polepieces and held between them.

In FIG. 3, an electron beam 1 is deflected by two stages of deflection coils 2. An objective lens 8 magnifies a transmission image of the specimen. Indicated by 7 is an objective-lens coil. The objective lens has an upper polepiece 5 and a lower polepiece 6. A specimen 3 made of a magnetic material is placed in the upper polepiece where no magnetic field is present. Magnetic coils 4 apply a magnetic field to the specimen 3. The operation of the apparatus constructed in this way is described below.

The electron beam 1 emitted from an electron gun (not shown) is deflected by the two stages of deflection coils 2 and made to impinge on the specimen 3. At the same time, the magnetic coils 4 apply the magnetic field to the specimen 3. As a result, the magnetic domains in the specimen 3 are varied. The direction of magnetization is made different among individual domains. Under this condition, the beam transmitted through the specimen 3 passes through openings 9a and 9b formed in the polepieces. At this time, the objective lens field between the upper polepiece 5 and the lower polepiece 6 of the objective lens focuses the beam, forming a first transmission image. Then, it enters the imaging system (not shown) where the transmission image of the specimen is magnified in turn. Finally, the beam is focused onto a fluorescent screen or onto the sensitive surface of a CCD camera, thus permitting observation of the magnetic domains in the specimen.

FIG. 4 shows another example of configuration of the prior art instrument illustrated In JP-A-2007-80724 (paragraphs [0014]-[0022] and FIGS. 1 and 2). In FIG. 4, an electron beam 11 is deflected by a first deflector 12. There is also shown a second deflector 25. A second deflector coil (excitation coil) 25a is wound around the yoke of the second deflector 25.

A first principal deflection plane 14 is formed at the position of the first deflector 12. Indicated by 15 is a second principal deflection plane. A specimen 16 undergoes an inspection by an electron microscope, and is positioned at the front end of a specimen holder 17 of a magnetic field application mechanism having a gap 18 across which a magnetic field is applied. Also shown are an objective lens 19 and an objective-lens coil 27.

An objective lens gap 26 is placed in a stage following the specimen 16 and acts to serve a first focusing action immediately under the specimen. A coil 13 is wound around a front-end portion of the specimen holder 17 of the magnetic field application mechanism. The optical axis of the electron beam 11 is indicated by 30. The operation of the apparatus constructed in this way is as follows.

FIG. 5 is a schematic diagram illustrating the operation of the apparatus of the structure shown in FIG. 4. In FIG. 5, the specimen 16 undergoes the first focusing action of the objective lens 19 to form an objective lens image 20. The electron beam 11 impinges at an angle of incidence 21 on the specimen 16.

The electron beam 11 converged by a condenser lens (not shown) travels along the optical axis 30 and is slightly deflected by the first deflector 12 at the first principal deflection plane 14. On the other hand, the second deflector 25 is placed as close to the specimen 16 as possible. Therefore, the beam 11 is deflected at the second principal deflection plane 15 lying immediately above the specimen 16 and made to impinge at the on-axis center of the specimen 16.

In the specimen holder 17 of the magnetic field application mechanism, the specimen 16 is held in the magnetic field gap 18. Lines of magnetic force produced across the gap 18 apply a magnetic field to the specimen 16, and deflect the electron beam. A transmission electron image representing variations in the magnetic domains in the specimen due to the application of the magnetic field is focused as an objective lens image 20 by the lens action of the objective lens gap 26. Then, the objective lens image 20 is magnified by plural stages of focusing systems (not shown) until a desired magnification is produced. Finally, a high-magnification image is formed on an electron-beam dry plate, TV-like detector, or the like.

This kind of electron microscope permits observation of magnetic domains, the microscope having means to apply a magnetic field mounted within an objective lens, means to deflect and correct an electron beam mounted between the objective lens and an imaging lens, a means for selecting and applying an arbitrary phase of an alternating magnetic field, and a means for exciting an applied magnetic field using a synchronizing signal for image display means (see, for example, JP-A-8-96737 (paragraph [0007] and FIG. 1)).

The above-described prior art satisfies some key points in observing magnetic fields. That is, the magnetic field around the specimen is eliminated. The magnetic field applied to the specimen is controlled. However, there is the problem that it is difficult to make a correction for a greatly deflected electron beam in cases where the magnetic field is applied to the specimen.

SUMMARY OF THE INVENTION

It is an object of the present invention to provide a magnetic domain imaging system permitting application of a strong magnetic field to a specimen.

A first embodiment of the present invention provides a magnetic domain imaging system for use with a transmission electron microscope including an objective lens having upper and lower polepieces. A magnetic specimen is placed in the upper polepiece. The imaging system is so designed that an electron beam transmitted through the specimen is imaged and displayed on a display device. The imaging system has a field application coil assembly for applying a magnetic field to the specimen and deflection coil assemblies for bringing the electron beam deflected by the field applied to the specimen back to the optical axis. The field application coil assembly and the deflection coil assemblies are disposed within the upper polepiece of the objective lens.

A second embodiment of the present invention is based on the first embodiment and further characterized in that the deflection coil assemblies are composed of an entrance deflection coil assembly and an exit deflection coil assembly which are disposed ahead of and behind, respectively, the field application coil assembly.

A third embodiment of the present invention is based on the first or second embodiment and further characterized in that each of the coils of the coil assemblies includes a core made of a magnetic material having small hysteresis.

A fourth embodiment of the present invention is based on the first embodiment and further characterized in that the deflection coil assemblies produce X and Y deflections and that rotation caused by deflections is corrected.

A fifth embodiment of the present invention is based on the second embodiment and further characterized in that the field application coil assembly and the entrance and exit deflection coil assemblies are shifted by about 45° with respect to each other in the senses of the X and Y directions.

A sixth embodiment of the present invention is based on the second embodiment and further characterized in that the distance l between the front end of the exit deflection coil assembly and the opposite inner surface of the upper polepiece and the distance r between the front end of the exit deflection coil assembly and the optical axis satisfy the relationship l>2r.

A seventh embodiment of the present invention is based on the second embodiment and further characterized in that the distance L1 between the mutually opposite coils of the entrance deflection coil assembly and the distance L1 between the mutually opposite coils of the exit deflection coil assembly are set less than a half of the distance L2 between the mutually opposite coils of the field application coil assembly.

According to the first embodiment, the deflection coil assemblies are mounted on the entrance and exit sides, respectively, adjacently to the field application coil assembly and, therefore, the amount of correction needed to correct the deflection caused by the field application can be halved. Consequently, the electron beam can be suppressed from greatly deviating from the optical axis.

According to the second embodiment, deflection of the electron beam due to excitation of the field application coil assembly can be corrected using the entrance and exit deflection coil assemblies.

According to the third embodiment, the cores of the coils of the deflection coil assemblies are made of a material with small hysteresis. Therefore, a linear relationship can be created between the electrical current flowing through the excitation coils and the resulting magnetic flux. Hence, accurate alignment to the optical axis can be accomplished.

According to the fourth embodiment, the electron beam can be deflected in two dimensions. In consequence, deflection can be done such that rotation of the beam due to deflection by the previous stage is corrected.

According to the fifth embodiment, the mutual effects of magnetic fields leaking from the field application coil assembly, entrance deflection coil assembly, and exit deflection coil assembly can be reduced and so accurate axial alignment can be made.

According to the sixth embodiment, the effects of magnetic fields leaking from the polepieces on the exit deflection coil assembly are reduced. Therefore, the electron beam can be accurately aligned axially.

According to the seventh embodiment, the distance between the entrance deflection coil assembly and the exit deflection coil assembly is set less than a half of the distance between the mutually opposite coils of the field application coil assembly. This reduces the effects of the magnetic fields produced by the coil assemblies. Consequently, the electron beam can be accurately aligned axially.

Other objects and features of the invention will appear in the course of the description thereof, which follows.

DESCRIPTION OF THE PREFERRED EMBODIMENTS

Embodiment 1

Figure 1:
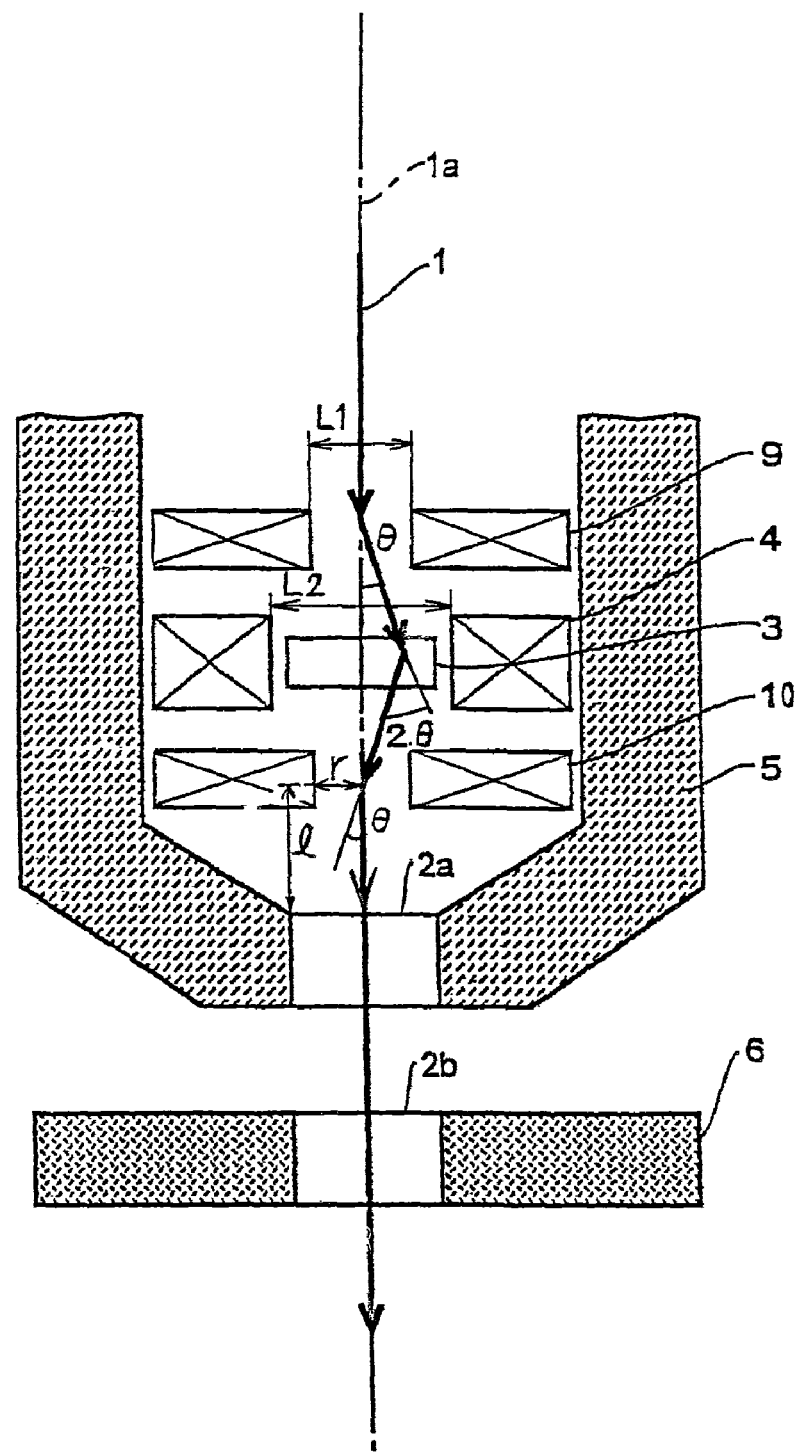
FIG. 1 is a schematic vertical cross section of a magnetic domain imaging system according to one embodiment of the present invention.

Embodiments of the present invention are hereinafter described in detail with reference to the drawings. FIG. 1 is a vertical cross section showing a magnetic domain imaging system, according to one embodiment of the present invention. In both FIGS. 1 and 3, like components are indicated by like reference numerals. Shown in FIG. 1 are an electron beam 1, an optical axis 1a connecting the centers of optical devices (such as lens deflection systems), an upper polepiece 5 of an objective lens, a lower polepiece 6 of the objective lens, a magnetic specimen 3, a field application coil assembly 4 having coils mounted on the opposite sides of the specimen 3, an entrance deflection coil assembly 9 disposed over the field application coil assembly 4, an exit deflection coil assembly 10 disposed under the field application coil assembly 4, an opening 2a formed in the upper polepiece 5 to permit passage of transmitted electrons, and an opening 2b formed in the lower polepiece 6 to permit passage of the transmitted electrons.

Figure 3:
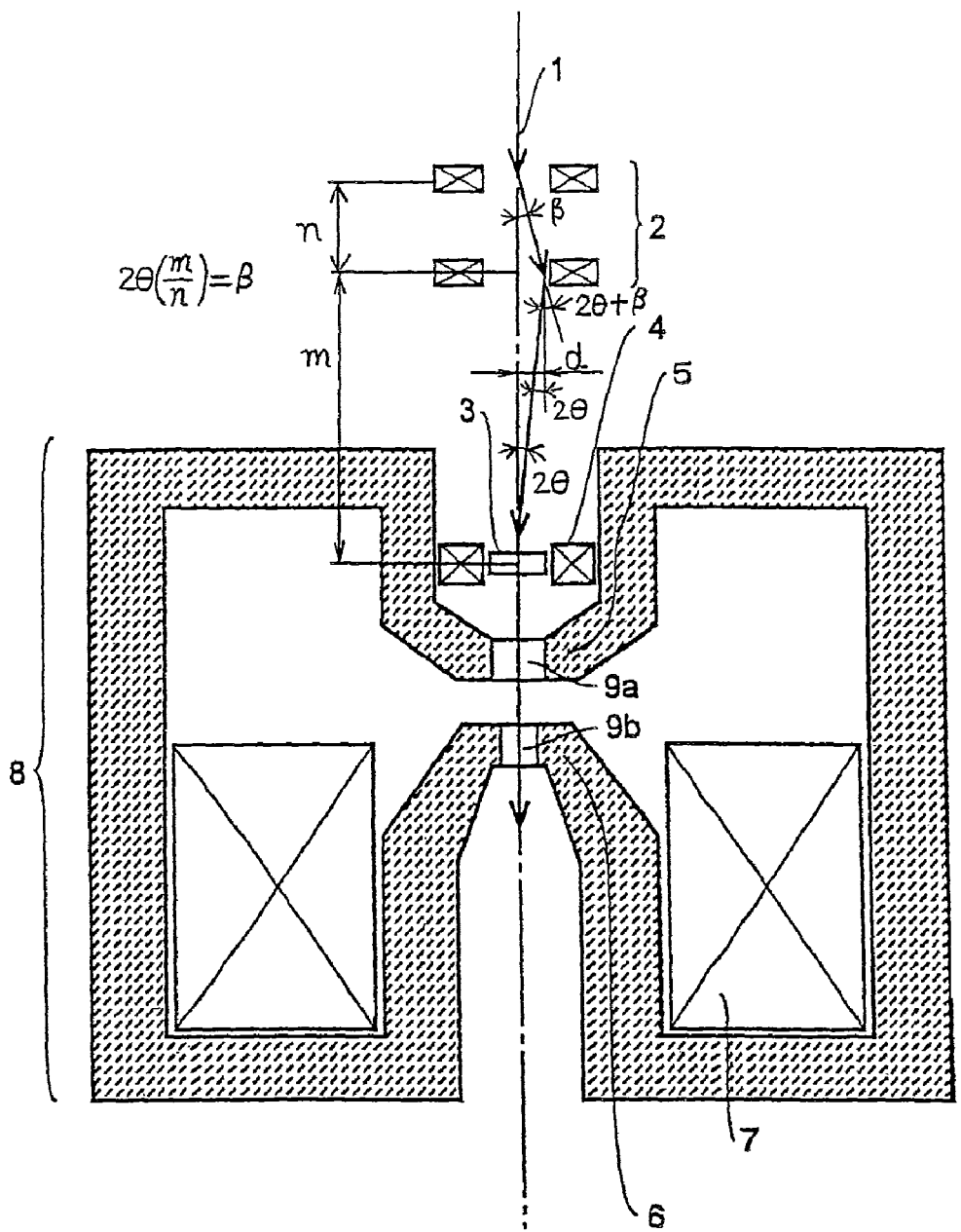
FIG. 3 is a vertical cross section of a conventional magnetic domain imaging system.
Figure 4:
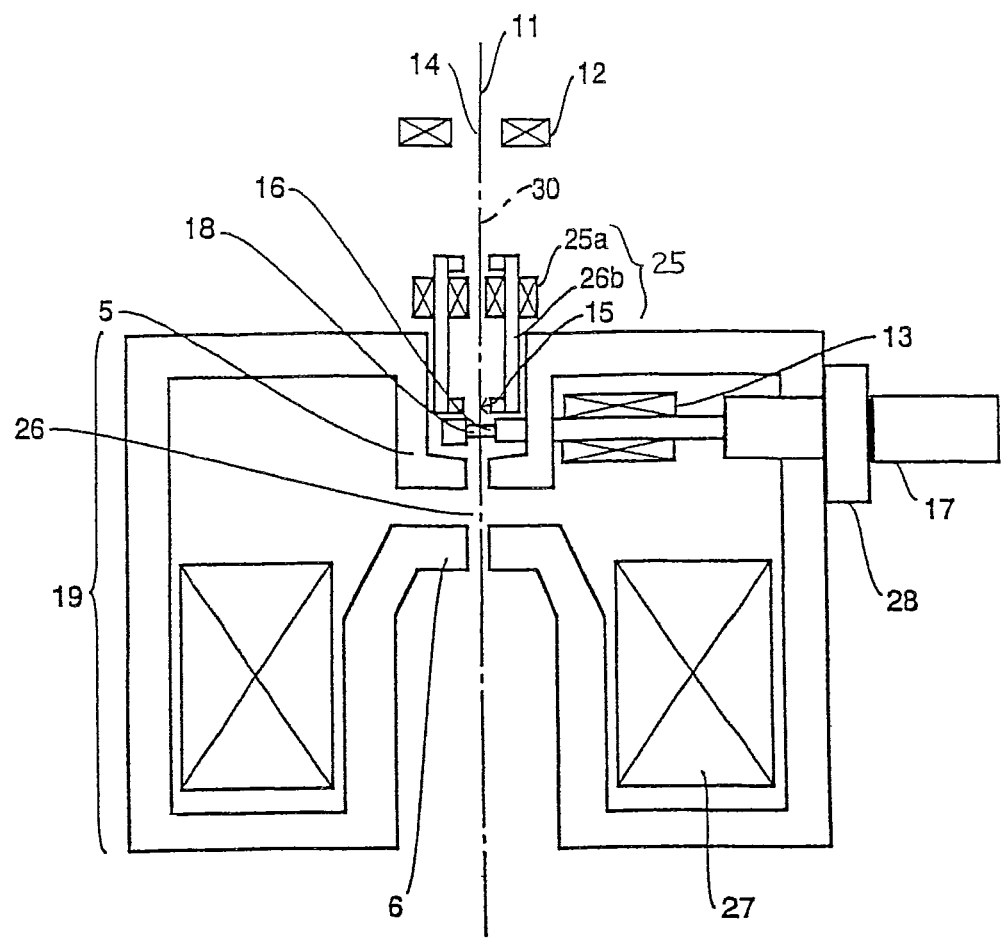
FIG. 4 is a vertical cross section of another conventional magnetic domain imaging system.
Figure 5:
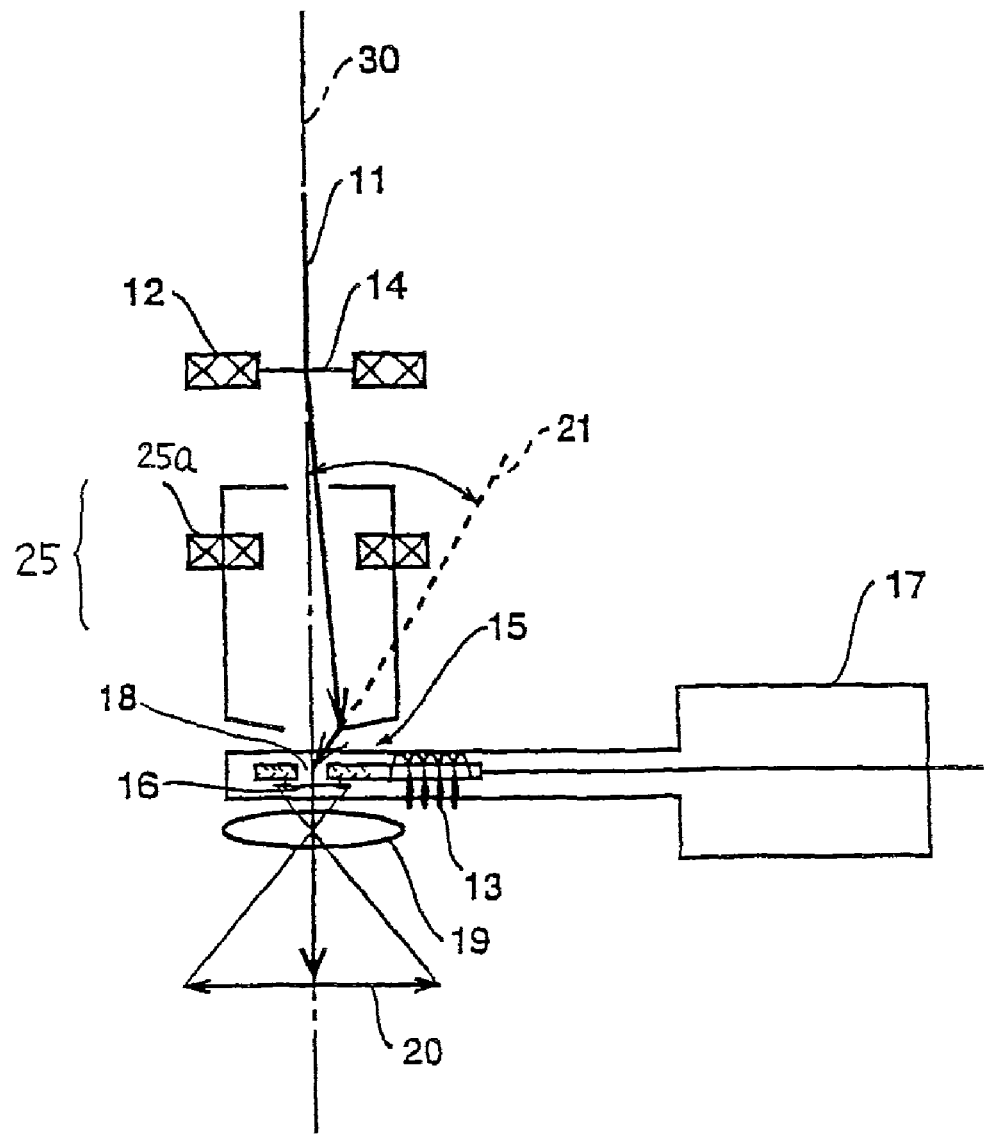
FIG. 5 is a schematic diagram illustrating the operation of the conventional system shown in FIG. 4.

All of the specimen 3, field application coil assembly 4, entrance deflection coil assembly 9, and exit deflection coil assembly 10 are placed in a region surrounded by the upper polepiece. The differences with the system shown in FIG. 3 are that the components are placed in the region surrounded by the polepieces and that the entrance and exit deflection coil assemblies are mounted on the opposite sides of the field application coil assembly. The operation of the system constructed in this way is described below.

The electron beam 1 focused by an illumination optical system (not shown) impinges on the specimen 3. If the field application coil assembly 4 is electrically energized to align the magnetic domains in the specimen 3 or to provide contrast among the domains, the beam 1 hitting the specimen 3 is deflected through 2θ. Under this condition, the beam 1 will deviate from the optical axis 1a by 2θ.

Accordingly, the beam impinging on the specimen is deflected by an angle minus θ, or a half of the angle 2θ by which the beam has been deflected by the applied magnetic field, by means of the entrance deflection coil assembly 9. As a result, the beam deflected through 2θ by the field applied to the specimen 3 deviates by the angle θ from the optical axis 1a and exits from the specimen. Accordingly, the beam is deflected through the angle minus θ by the exit deflection coil assembly 10 to bring the beam back to the optical axis. Consequently, the beam 1 passes along the optical axis 1a and enters the imaging system (not shown).

In the present invention, the deflection coil assemblies are mounted on the entrance side and on the exit side, respectively, adjacently to the field application coil assembly. Consequently, the amount of correction needed to cancel the deflection caused by the field application is halved on each side. Hence, the beam can be suppressed from deviating off the axis greatly. Furthermore, as the beam 1 passes along the optical axis 1a, it is possible to observe magnetic domains in the specimen precisely.

Furthermore, in the present invention, it is the specimen position where the beam is deflected to its greatest extent while the axis of the beam is aligned (i.e., where the strongest deflection field is present). Thus, strong magnetic fields can be applied to the specimen.

Embodiment 2

In the system shown in FIG. 1, the cores of the coils of the coil assemblies can be made of a magnetic substance having small hysteresis, such as an iron-nickel soft magnetic material (such as Permalloy). In order to accurately align the beam to the optical axis, there must be a linear relationship between the excitation coil current and the produced magnetic flux. If there is hysteresis, there is no proportional relationship between the excitation coil current and the produced magnetic flux. Accordingly, a proportional relationship can be developed between them by fabricating the cores of the coils from a low-hysteresis material. As a result, accurate alignment with the optical axis can be accomplished.

Embodiment 3

In the structure shown in FIG. 1, the entrance deflection coil assembly 9 and exit deflection coil assembly 10 can be made to perform X and Y deflections, respectively. Thus, the electron beam 1 can be deflected in two dimensions. Consequently, the next stage of deflection can be done according to the rotation caused by the deflection.

Embodiment 4

Figure 2:
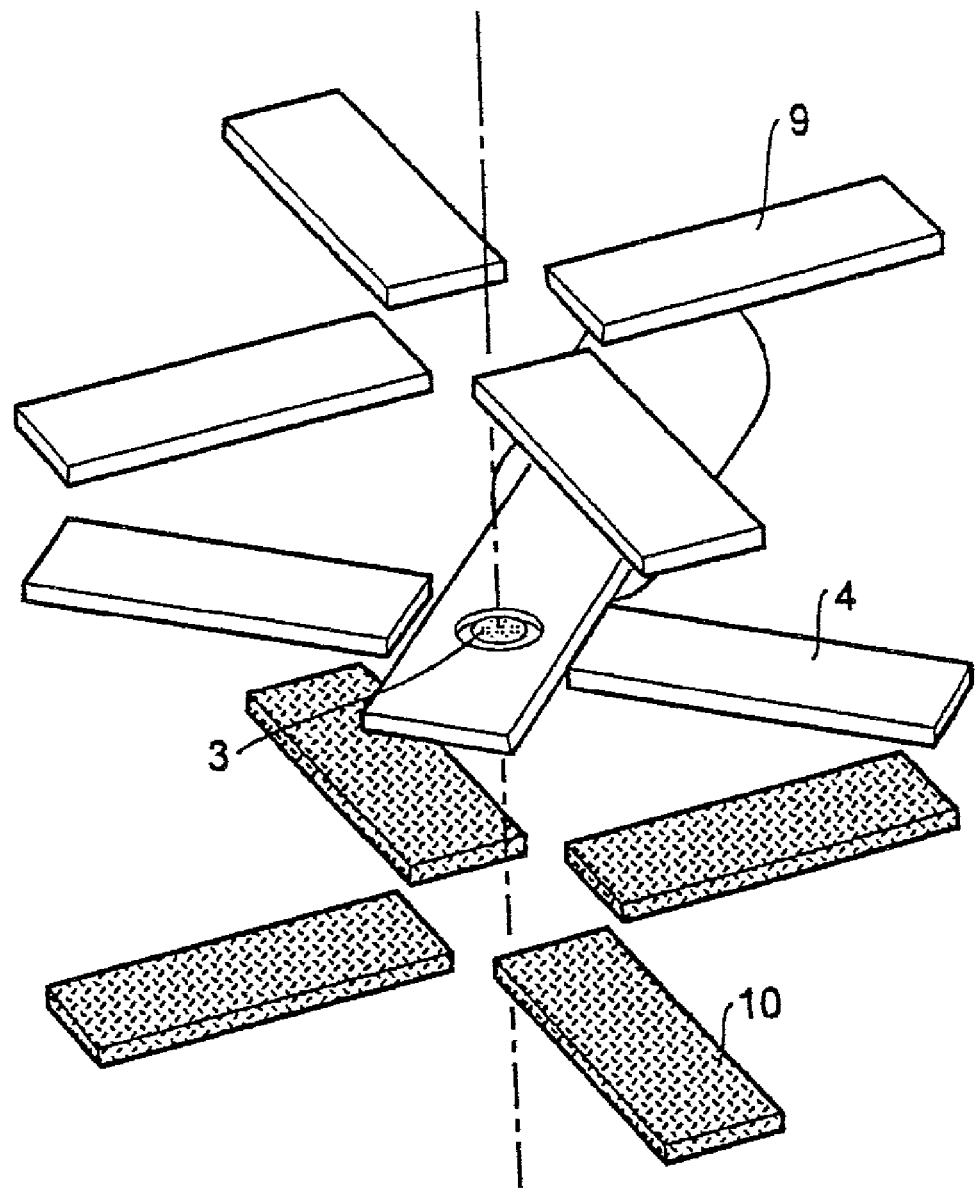
FIG. 2 is a perspective view of main parts of a magnetic domain imaging system according to another embodiment of the present invention.

FIG. 2 is a perspective view showing the main portions of a further embodiment of the present invention. In FIGS. 1 and 2, like components are indicated by like reference numerals. Shown in FIG. 2 are entrance deflection coil assembly 9, field application coil assembly 4, exit deflection coil assembly 10, and the specimen 3 surrounded by these coil assemblies. The field application coil assembly 4 is shifted by 45° with respect to the entrance deflection coil assembly 9. The exit deflection coil assembly 10 is shifted by 45° with respect to the field application coil assembly 4. In this arrangement, it is possible to reduce the mutual effects of the magnetic fields leaking from the coil assemblies 9, 4, and 10. Consequently, accurate alignment of the electron beam with the axis can be accomplished.

Embodiment 5

Referring to FIG. 1, r is the distance between the exit deflection coil assembly 10 and the optical axis 1a, and l is the distance between the exit deflection coil assembly 10 and the upper polepiece 5 of the objective lens. This mechanism is so designed that l>2r. This reduces the effects of the magnetic fields leaking from the polepieces on the exit deflection coil assembly 10. Consequently, the electron beam can be aligned accurately.

Embodiment 6

The distance L1 between the opposite coils of the entrance deflection coil assembly 9 and the distance L1 between the opposite coils of the exit deflection coil assembly 10 are set less than a half of the distance between the opposite coils of the field application coil assembly 4. In FIG. 1, the distance between the opposite coils of the entrance deflection coil assembly 9 is L1. The distance between the opposite coils of the exit deflection coil assembly 10 is also L1. The distance between the opposite coils of the field application coil assembly 4 is L2. In this arrangement, the distance L1 between the opposite coils of the entrance deflection coil assembly 9 or of the exit deflection assembly 10 is set less than a half of the distance L2 between the opposite coils of the field application coil assembly 4.

There is a demand for making the magnetic field produced by the beam deflection coil assemblies 9 and 10 independent of the magnetic field generated by the field application coil assembly 4. Accordingly, the mutual effects of the magnetic fields set up by the deflection coil assemblies 9, 10 and by the field application coil assembly 4 are reduced by arranging the coil assemblies in such a way that the distance L1 between the opposite coils of the entrance deflection coil assembly 9 or of the exit deflection coil assembly 10 is less than a half of the distance L2 between the opposite coils of the field application coil assembly 4. This makes it possible to accurately align the electron beam with the axis.

As described in detail so far, according to the present invention, deflection coil assemblies are mounted on the entrance side and on the exit side, respectively, adjacently to a field application coil assembly. The amount of correction needed to correct the deflection caused by the magnetic field application is only a half of the deflection angle on each side. Consequently, the electron beam can be suppressed from greatly deviating from the optical axis. The present invention is effective for avoiding the effects of aberrations in cases where magnetic domains are observed while restricting the electron beam.

Furthermore, in the above embodiments, the coil system consisting of the entrance deflection coil assembly, field application coil assembly, and exit deflection coil assembly can be reduced in size as a whole.

Having thus described my invention in the detail and particularity required by the Patent Laws, what is desired protected by Letters Patent is set forth in the following claims.

The invention claimed is:

1. A magnetic domain imaging system having a transmission electron microscope including an objective lens having upper and lower polepieces, the imaging system being so designed that an electron beam transmitted through a magnetic specimen placed in the upper polepiece is imaged and displayed on a display device, said magnetic domain imaging system comprising:

a field application coil assembly for applying a magnetic field to the specimen; and deflection coil assemblies for bringing the electron beam deflected by the field applied to the specimen back to an optical axis, wherein the field application coil assembly and the deflection coil assemblies are disposed within the upper polepiece of the objective lens.

2. A magnetic domain imaging system as set forth in claim 1, wherein said deflection coil assemblies are composed of an entrance deflection coil assembly placed in a stage preceding said field application coil assembly and an exit deflection coil assembly placed in a stage following the field application coil assembly.

3. A magnetic domain imaging system as set forth in claim 1 or 2, wherein each of coils of the coil assemblies has a core made of a magnetic material having small hysteresis.

4. A magnetic domain imaging system as set forth in claim 1, wherein said deflection coil assemblies produce X and Y deflections and correct rotation caused by deflections.

5. A magnetic domain imaging system as set forth in claim 2, wherein said entrance deflection coil assembly, field application coil assembly, and exit deflection coil assembly are shifted by about 45° with respect to each other in senses of X and Y directions.

6. A magnetic domain imaging system as set forth in claim 2, wherein the distance l between the front end of the exit deflection coil assembly and an opposite inner surface of the upper polepiece and the distance r between the front end of the exit deflection coil assembly and the optical axis satisfy a relationship given by l>2r.

7. A magnetic domain imaging system as set forth in claim 2, wherein the distance between mutually opposite coils of the entrance deflection coil assembly and the distance between mutually opposite coils of the exit deflection coil assembly are set less than a half of the distance between mutually opposite coils of the field application coil assembly.

* * * * *